(12) United States Patent
Ramaraju et al.

(10) Patent No.: US 7,200,020 B2
(45) Date of Patent: Apr. 3, 2007

(54) STORAGE ELEMENT WITH CLEAR OPERATION AND METHOD THEREOF

(75) Inventors: Ravindraraj Ramaraju, Round Rock, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 59 days.

(21) Appl. No.: 11/215,655

(22) Filed: Aug. 30, 2005

(65) Prior Publication Data

US 2007/0047281 A1 Mar. 1, 2007

(51) Int. Cl.
*G11C 15/00* (2006.01)
(52) U.S. Cl. .................. 365/49; 365/156; 365/190
(58) Field of Classification Search .......... 365/189.01, 365/49, 154, 190, 189.09, 189.11, 156
See application file for complete search history.

(56) References Cited

U.S. PATENT DOCUMENTS

| | | | | |
|---|---|---|---|---|
| 5,532,958 | A * | 7/1996 | Jiang et al. | 365/154 |
| 6,172,900 | B1 * | 1/2001 | Mejia | 365/154 |
| 6,301,186 | B1 | 10/2001 | Naffziger | |
| 6,353,551 | B1 | 3/2002 | Lee | |
| 6,370,052 | B1 * | 4/2002 | Hsu et al. | 365/49 |
| 6,772,277 | B2 | 8/2004 | Naffziger | |
| 6,804,143 | B1 * | 10/2004 | Hobson | 365/154 |
| 6,873,565 | B1 | 3/2005 | Riedlinger et al. | |
| 6,920,061 | B2 * | 7/2005 | Bhavnagarwala et al. | 365/154 |
| 7,016,211 | B2 * | 3/2006 | Park et al. | 365/49 |
| 7,113,445 | B1 * | 9/2006 | Sancheti et al. | 365/230.05 |
| 2004/0136253 | A1 * | 7/2004 | Gupta et al. | 365/205 |

OTHER PUBLICATIONS

Takeda, Koichi et al.; "A Read-Static-Noise-Margin-Free SRAM Cell for Low-$V_{dd}$ and High-Speed Applications"; ISSCC 2005 Digest of Technical Papers; pp. 478-479 & 611.

* cited by examiner

*Primary Examiner*—Richard T. Elms
*Assistant Examiner*—Hien N Nguyen
(74) *Attorney, Agent, or Firm*—Robert L. King; Ranjeev Singh

(57) ABSTRACT

A storage device and a method in the storage element, where the storage element has a first data storage node and a second data storage node and where the first data storage node is coupled to a bit line via a first pass transistor and where the second data storage node is coupled to a complementary bit line via a second pass transistor, is provided. The method includes performing a clear operation on the first data storage node and the second data storage node by providing a clear signal to a first clear transistor coupled to the first data storage node and a second clear transistor coupled to the second data storage node.

23 Claims, 3 Drawing Sheets

STORAGE ELEMENT WITH CLEAR OPERATION AND METHOD THEREOF

FIELD OF THE INVENTION

This invention relates generally to semiconductors, and more specifically, to semiconductor devices that store information.

BACKGROUND OF THE INVENTION

Data storage devices, such as a static random access memory (SRAM), could have the content of their storage elements cleared by a clear operation during an initialization, a power-up operation or at other times. One known implementation of a memory storage element is a cross-coupled inverter pair in which an output of a first inverter is connected to an input of a second inverter and the output of the second inverter is connected to the input of the first inverter. The cross-coupled inverter pair has two data storage nodes. A first data storage node is at the input of the first inverter and the second data storage node is at the output of the first inverter. As a result, a data bit is stored in a true and complement form. The data bit is cleared to a zero (or one) bit value by forcing one of the two forms of the data bit to a ground potential. A clear line conductor is implemented across a column of memory storage elements.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
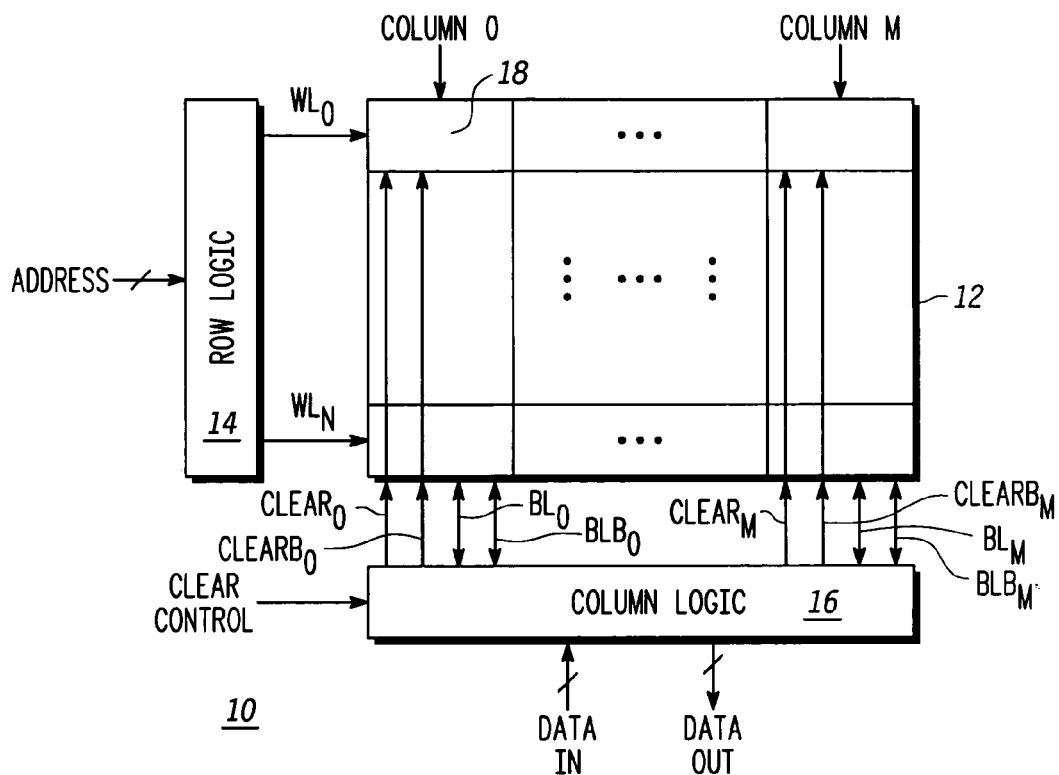
FIG. 1 illustrates in block diagram form a memory implemented in accordance with one form of the present invention.

Illustrated in FIG. 1 is a memory 10 having a clear operation and clear circuitry in accordance with one form of the present invention. Various memories use a clear operation. Typically clear operations are used when an initialization or power-up occurs. A clear operation will clear a predetermined portion (i.e. some) or all storage elements of a memory regardless of whether the storage elements selected for clearing have been previously programmed or not. To clear a storage element, the storage element is cleared to hold a zero logic state. However, it should be understood that the methods used herein may clear to a one logic state also. Memory 10 has an array 12 of individual storage elements, such as storage element 18, arranged in (N+1) rows and (M+1) columns, where N and M are integers. Coupled to the array 12 is row logic circuitry 14 and column logic circuitry 16. A multiple bit input data path for receiving input data is connected to the column logic circuitry 16. Column logic circuitry 16 also has a multiple bit output data path for providing output data. A CLEAR CONTROL signal is connected to a control input terminal of the column logic circuitry 16 for enabling when a clear operation is performed. In one form, for each of the M columns, array 12 has two clear conductors which run the length of the column. The two clear conductors are a true and a complement clear conductor. For example, in the first column 0 clear conductors labeled $CLEAR_0$ and $CLEARB_0$ extend from column logic 16 through each storage element in the $0^{th}$ column. Also extending the length of the column are two bit line conductors respectively labeled $BL_0$ and $BLB_0$ which are in true and complement form. For the $M^{th}$ column, the two clear conductors are labeled $CLEAR_M$ and $CLEARB_M$ and the bit line conductors are labeled $BL_M$ and $BLB_M$. It should be understood that each of the (M+1) columns may contain two clear conductors or only a portion of the columns may be implemented having two clear conductors in each column. The row logic circuitry 14 receives an input address. The row logic circuitry 14 functions to decode the input address and implement a row driver function to assert a predetermined one of the word lines $WL_0$ through $WL_N$. A storage element within the array 12 of storage elements is selected to be written or read when both the word line and the bit lines intersecting that storage element is asserted. Depending upon whether a read or a write operation is enabled, the column logic 16 will output data from a selected storage device or will source data to the selected storage element for programming. A clear operation of the memory 10 occurs in response to the CLEAR CONTROL signal. All of the columns of array 12 may be concurrently cleared. In another form, the clearing of array 12 is implemented in stages or only a portion of the storage elements in array 12 is cleared. It should be noted that for purposes of convenience of illustration, not all conductive lines are illustrated extending through the columns. In particular, in the first column only the clear lines are illustrated as extending through the columns but the bit line conductors also extend through the entire column.

Figure 2:
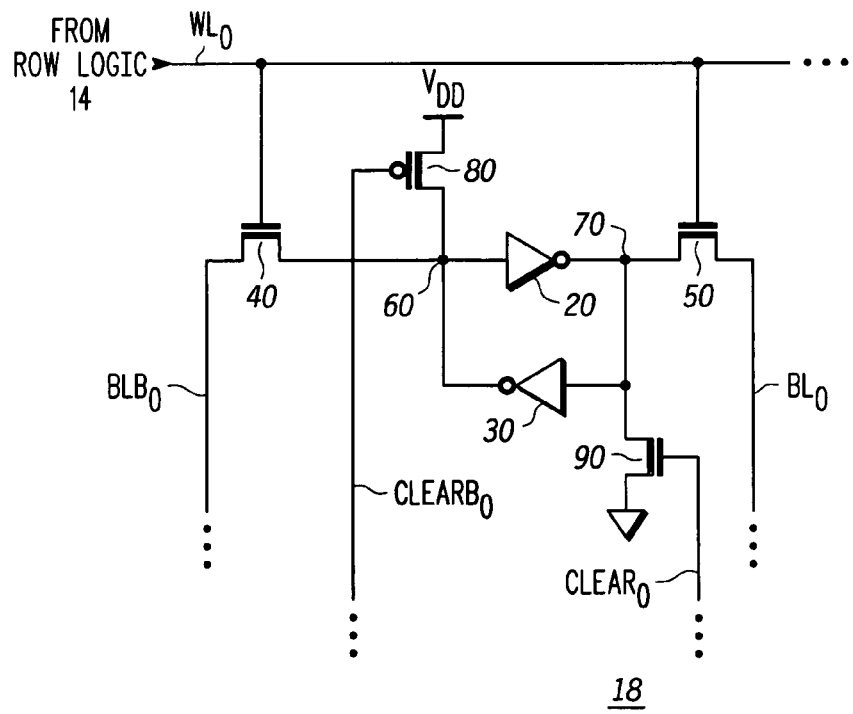
FIG. 2 illustrates in schematic form a storage element of the memory of FIG. 1 in accordance with one form of the present invention.

Illustrated in FIG. 2 is one form of storage element 18 of FIG. 1. A first cross-coupled inverter 20 and a second cross-coupled inverter 30 form a cross-coupled inverter pair that functions to store a data bit at a first data storage node 70 and a complement of the data bit at a second data storage node 60. A first pass transistor 50 has a gate connected to the word line $WL_0$ supplied by row logic circuitry 14. A source of the first pass transistor 50 is connected to the bit line $BL_0$ and a drain of the first pass transistor 50 is connected to an output of the first cross-coupled inverter 20 at the first data storage node 70. A second pass transistor 40 has a gate connected to the word line $WL_0$, a source connected to the complement bit line $BLB_0$ and a drain connected to the input of the first cross-coupled inverter 20 at the second data storage node 60. The input of the first cross-coupled inverter 20 is connected to the second data storage node 60 and the output of the first cross-coupled inverter 20 is connected to the first data storage node 70. An input of the second cross-coupled inverter 30 is connected to the first data storage node 70 and an output of the second cross-coupled inverter 30 is connected to the second data storage node 60.

A first clear transistor 90 has a gate connected to a first clear conductor labeled $CLEAR_0$. A source of the first clear transistor 90 is connected to a ground reference voltage terminal and a drain of the first clear transistor 90 is connected to the first data storage node 70. A second clear transistor 80 has a gate connected to a second clear conductor labeled $CLEARB_0$. A source of the second clear transistor 80 is connected to a power supply voltage terminal labeled $V_{DD}$. A drain of the second clear transistor 80 is connected to the second data storage node 60. In the illustrated form transistors 40, 50 and 90 are N-channel MOS or NMOS transistors and transistor 80 is a P-channel MOS or PMOS transistor.

In operation, the reading or writing of storage element 18 is performed under the control of row logic circuitry 14 and column logic circuitry 16 by asserting word line $WL_0$. For a read operation, the bit lines $BL_0$ and $BLB_0$ have been precharged to a logic high state. The previously stored data values at the first data storage node 70 and the second data storage node 60 determine whether the precharged logic high state remains on the bit lines $BL_0$ and $BLB_0$. For example if the first data storage node 70 is storing a logic low state, then bit line $BL_0$ will change to a logic low state via the conduction of pass transistor 50. The logic low state of bit line $BL_0$ will be sensed by the column logic 16 and the storage element 18 will be read as a low logic state.

For a write operation, the write word line $WL_0$ is brought to a high logic state and asserted. As a result, pass transistors 40 and 50 are conductive. The complementary bit lines $BL_0$ and $BLB_0$ which are asserted by the column logic circuitry 16 transfer the logic state to be written onto the data storage nodes 70 and 60, respectively.

For a clear operation, the signal $CLEAR_0$ is asserted with a logic high state by column logic circuitry 16 in response to the CLEAR CONTROL signal. The column logic circuitry 16 also generates a complementary clear signal which is applied to the gate of the P-channel clear transistor 80. Clear transistor 80 and clear transistor 90 become conductive. As a result, the data storage node 70 is connected to a ground reference potential. The data storage node 60 is connected to the power supply voltage $V_{DD}$. The result is to program the storage element 18 with a logic zero value.

It should be noted that the clear operation disclosed herein provides a dual-ended method wherein each storage node of the storage element 18 is connected to a fixed reference potential. In this way, there is avoided the possibility that one of the storage nodes may not be adequately cleared. In previous clear operation implementations, a clear signal is applied to one data storage node and the cleared value must be reflected to the complementary node. However, in implementations where a low voltage power supply voltage is used, there is an increasing likelihood that an indeterminate logic state or an incorrect logic state will result from the clear operation. Also, with a reduction in transistor dimensions, larger variation in transistor dimensions and device strengths will occur. As a result, transistor strength ratios may not be precise enough in all bits of thousands of storage elements in a memory to avoid an indeterminate logic state at a storage node following a clear operation. These transistor variation issues are solved by the use of the clear method described herein. In particular, clear transistor 80 is making sure that storage node 60 is placed at a definite high logic state in response to a clear operation while clear transistor 90 is making sure that data storage node 70 is placed at a definite low logic state.

Figure 3:
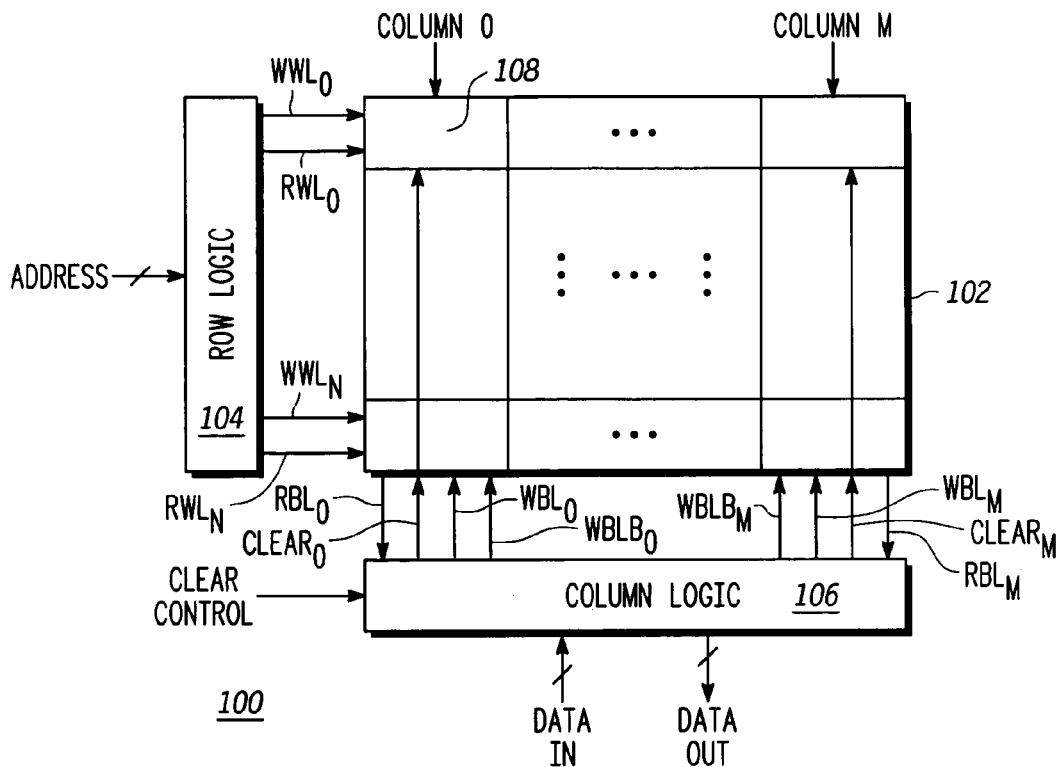
FIG. 3 illustrates in block diagram form a memory implemented in accordance with another form of the present invention.

Illustrated in FIG. 3 is a memory 100 having a clear operation and clear circuitry in accordance with another form of the present invention. Memory 100 has an array 102 of individual storage elements, such as storage element 108, arranged in (N+1) rows and (M+1) columns, where n and m are integers. Coupled to the array 102 is row logic circuitry 104 and column logic circuitry 106. A multiple bit input data path for receiving input data is connected to the column logic circuitry 106. Column logic circuitry 106 also has a multiple bit output data path for providing output data. A CLEAR CONTROL signal is connected to a control input terminal of the column logic circuitry 106 for enabling when a clear operation is performed. In one form, for each of the m columns, array 102 has one clear conductor which runs the length of the column. For example, in the first column 0 clear conductor $CLEAR_0$ extends from column logic circuitry 106 through each storage element in the $0^{th}$ column. Also extending the length of the column are three bit line conductors, two for a write and one for a read. The write bit line conductors are respectively labeled $WBL_0$ and $WBLB_0$ which are in true and complement form. The read bit line conductor is labeled $RBL^0$. For the $M^{th}$ column, the clear conductor is labeled $CLEAR_M$ and the write bit line conductors are labeled $WBL_M$ and $WBLB_M$ and the read bit line conductor is labeled $RLB_M$. It should be understood that each of the (M+1) columns contains one clear conductor. In another form only a portion of the columns may be implemented having a clear conductor in each column. The row logic circuitry 104 decodes the input address and implements a row driver function to assert a predetermined one of the word lines $WWL_0$ through $WWL_N$ and $RWL_0$ through $RWL_N$. A storage element within the array 102 of storage elements is selected to be written or read when both the word line and the bit line intersecting that storage element are asserted. Depending upon whether a read or a write operation is enabled, the column logic circuitry 106 will output data from a selected storage device or will source data to the selected storage element for programming. A clear operation of the memory 100 occurs in response to the CLEAR CONTROL signal. All of the columns of array 102 may be concurrently cleared. In another form, the clearing of array 102 is implemented in stages or only a portion of the storage elements in array 102 is cleared.

In operation, it should be noted that memory 100 is modified from memory 10 of FIG. 1 primarily in that a single clear line is implemented in each column of the array 102. For example, the first column utilizes the clear line $CLEAR_0$. Additionally, three bit lines per column are implemented. Two bit lines per column are dedicated to a write operation and a single bit line per column is dedicated to a read operation. Similarly, with respect to the row control circuitry of row logic circuitry 104, some variations from memory 10 exist. In particular, two word lines per row are implemented in memory 100. For each row, a write word line and a read word line are provided. The write word line and the read word line extend through an entire length of each row. The interaction of the write lines, bit lines and clear conductor for each column will become more apparent below in connection with the detailed illustration of the storage elements.

Figure 4:
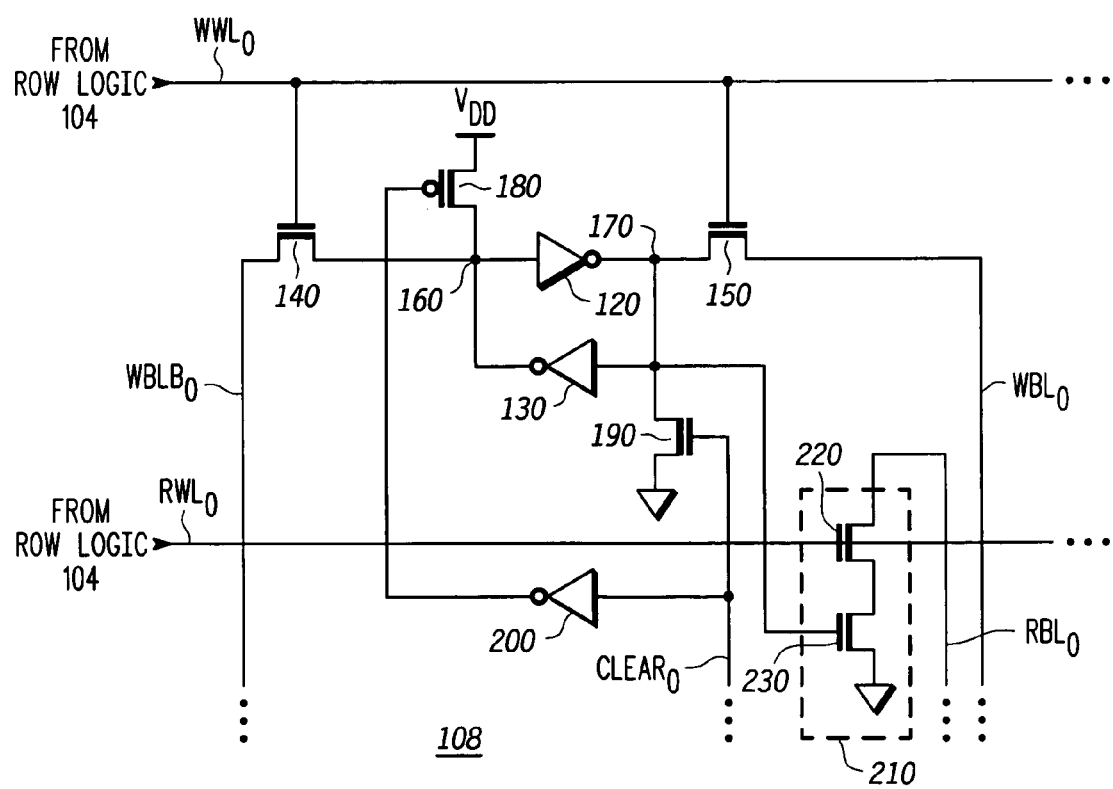
FIG. 4 illustrates in schematic form a storage element of the memory of FIG. 3 in accordance with one form of the present invention.

Illustrated in FIG. 4 is one form of a storage element 108 of the memory 100 of FIG. 3. A cross-coupled inverter pair in the form of a first cross-coupled inverter 120 and a second cross-coupled inverter 130 is provided. An output of the first cross-coupled inverter 120 is connected to an input of the second cross-coupled inverter 130 at a first data storage node 170. An output of inverter 130 is connected to an input of inverter 120 at a second data storage node 160. A first pass transistor 150 has a source connected to the first data storage node 170, a gate connected to the word line $WWL_0$ from row logic circuitry 104, and a drain connected to a write bit line $WBL_0$. A second pass transistor 140 has a drain connected to a complement write bit line $WBLB_0$, a gate connected to the write word line $WWL_0$ and a source connected to the input of inverter 120. A clear transistor 190 has a drain connected to the first data storage node 170, a gate connected to a clear line or clear conductor for receiving a clear signal $CLEAR_0$ and a source connected to a reference ground terminal. A clear transistor 180 has a source connected to a power supply voltage terminal for receiving a power supply voltage $V_{DD}$, a gate connected to an output of an inverter 200 and a drain connected to the second data storage node 160. The inverter 200 has an input connected to the clear line labeled $CLEAR_0$. A read bit line $RBL_0$ is connected to a drain of a transistor 220. A gate of transistor 220 is connected to the read word line $RWL_0$. A source of transistor 220 is connected to a drain of a transistor 230. A gate of transistor 230 is connected to the input of inverter 130. A source of transistor 230 is connected to a ground reference voltage. In combination transistor 220 and transistor 230 form a READ port 210. In the illustrated form transistors 140, 150, 190, 220 and 230 are N-channel MOS or NMOS transistors and clear transistor 180 is a P-channel MOS or PMOS transistor.

For a read operation, row logic circuitry 104 asserts read word line $RWL_0$ to a logic high state. In response, transistor 220 becomes conductive. The logic state stored at data storage node 170 determines the conductive state of transistor 230. If a logic high state is stored at data storage node 170, transistor 230 is conductive. As a result, read bit line $RBL_0$ is connected to ground and is at a low logic state in response to $RWL_0$ being asserted to a logic high state. If a logic low state is stored at data storage node 170, transistor 230 is nonconductive. As a result, read bit line $RBL_0$ remains in a precharge or logic high state. Transistors 220 and 230 connected in series form a READ port 210 of the storage element 108. READ port 210 therefore permits the reading of the stored data value of storage element 108.

For a write operation, the write word line $WWL_0$ is brought to a high logic state and asserted. As a result, pass transistors 140 and 150 are conductive. The complementary bit lines $WBL_0$ and $WBLB_0$ transfer the logic state to be written onto the data storage nodes 170 and 160, respectively.

For a clear operation, the signal $CLEAR_0$ is asserted with a logic high state by column logic circuitry 106 in response to the CLEAR CONTROL signal. The inverter 200 generates a complementary clear signal which is applied to the gate of the P-channel clear transistor 180. Clear transistor 180 and clear transistor 190 become conductive. As a result, the data storage node 170 is connected to a ground reference potential. The data storage node 160 is connected to the power supply voltage $V_{DD}$. The result is to program the storage element 108 with a logic zero value. Note that a single conductor per column used to implement a clear operation is an advantage in those designs in which an extra conductive line is not practical due to design constraints.

Figure 5:
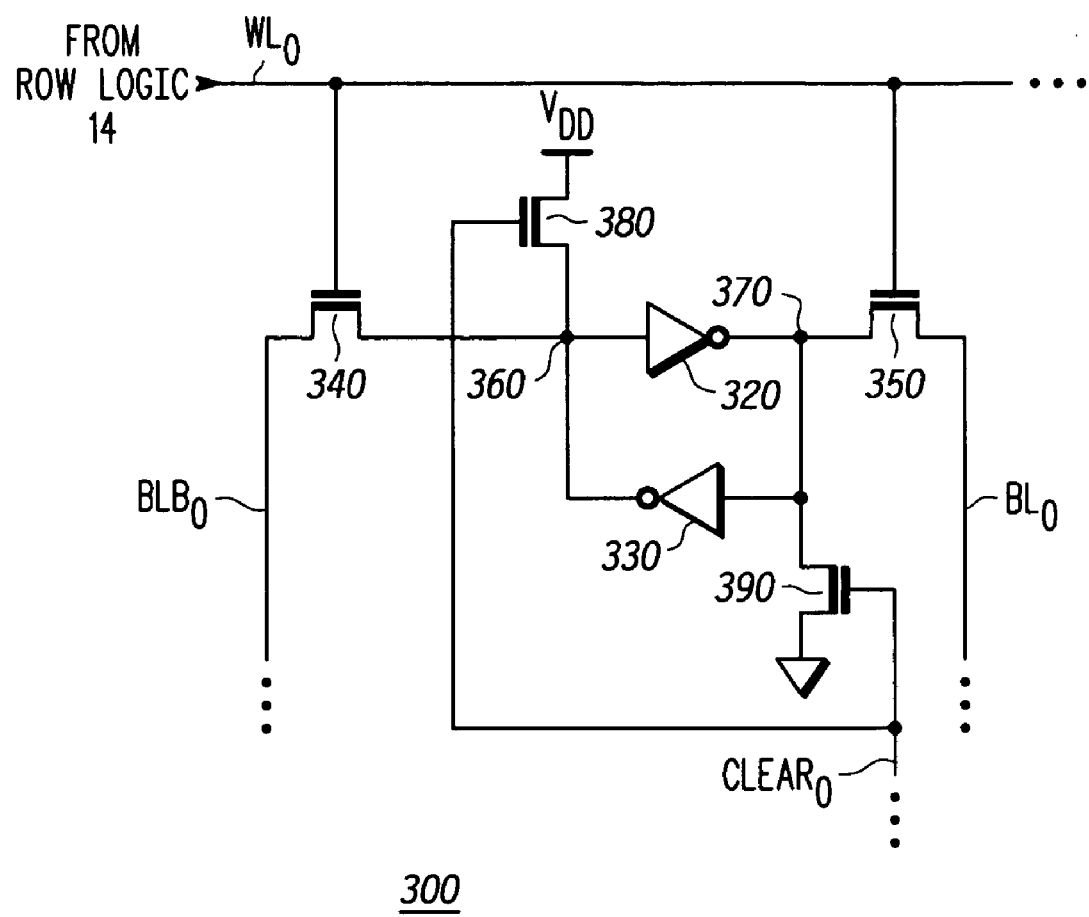
FIG. 5 illustrates in schematic form a storage element of the memory of FIG. 3 in accordance with yet another form of the present invention.

Illustrated in FIG. 5 is yet another form of a storage element 300 which may be used in either memory 10 or memory 100. Storage element 300 has a cross-coupled pair of inverters. An inverter 320 has an output connected to a first storage node 370. An input of inverter 320 is connected to a second storage node 360. An input of inverter 330 is connected to the first storage node 370. An output of inverter 330 is connected to the second storage node 360. A first pass transistor 350 has a source connected to a bit line $BL_0$, a gate connected to a word line $WL_0$ from row logic circuitry 14 and a drain connected to the first storage node 370. A second pass transistor 340 has a source connected to the second storage node 360, a gate connected to the word line $WL_0$, and a drain connected to the complement bit line $BLB_0$. A first clear transistor 390 has a drain connected to the first storage node 370, a gate connected to a clear signal $CLEAR_0$ and a source connected to a ground reference voltage terminal. A second clear transistor 380 has a drain connected to the second storage node 360, a gate connected to the clear signal $CLEAR_0$ and a source connected to a power supply voltage terminal for receiving a voltage labeled $V_{DD}$. In the illustrated form, transistors 340, 350, 380 and 390 are all N-channel MOS transistors.

In operation, reading and writing of the storage element 300 is analogous to the reading and writing of storage element 18 of FIG. 2. For a clear operation, a single clear line is used. However, two clear transistors are implemented, one associated with each data storage node of the single storage element. The $CLEAR_0$ line is asserted by column circuitry (not shown) in response to the CLEAR CONTROL signal of FIG. 1. When the $CLEAR_0$ line is asserted to a logic high state, clear transistors 380 and 390 are made conductive. Clear transistor 390 connects the first storage node 370 to the ground reference voltage terminal ensuring that a solid logic zero value is placed onto the first storage node 370. The clear transistor 380 is also conductive and places ($V_{DD}$ minus the threshold voltage of N-channel clear transistor 380) onto the second storage node 360. This voltage is a solid high logic state voltage and ensures that the storage element 300 is cleared to a zero logic state value at the first storage node 370.

By now it should be appreciated that there has been provided a data storage circuit within a memory array that has an accurate and reliable clear mechanism. In one form, two clear lines are used with two clear transistors. By using a first clear transistor of a first conductivity type to connect a first fixed reference potential to a first data storage node and using a second clear transistor of a second and opposite conductivity type to connect a second fixed reference potential to a second data storage node, definite voltages are placed onto the data storage nodes to ensure the accuracy of the cleared value which will be stored. By doing a dual-ended clear operation, a robust high speed reliable clear is performed resulting in a high speed memory system that can operate at low operating voltages, such as below one volt. Thus a robust and reliable clear operation is provided without increasing bit cell area of the storage element.

In the foregoing specification, the invention has been described with reference to specific embodiments. However, one of ordinary skill in the art appreciates that various modifications and changes can be made without departing from the scope of the present invention as set forth in the claims below. For example, the storage elements described herein may be implemented in various semiconductor technologies in addition to MOS such as bipolar and gallium arsenide. The circuitry may be built in bulk silicon or may be implemented overlying an insulator, known as silicon on insulator (SOI). The storage element methods described herein apply to any type of volatile memory in which data is lost when power is no longer applied. The circuitry and methods described herein apply to stand-alone memory designs, to cache memory designs and to other types of storage circuitry used in conjunction with data processor, digital signal processors, graphic processing units and microcontrollers as well as other types of data computing products.

In one form there has been provided a storage element having a first data storage node and a second data storage node. The first data storage node is coupled to a bit line via a first pass transistor and the second data storage node is coupled to a complementary bit line via a second pass transistor. A clear line is coupled via a first clear transistor to the first data storage node for performing a clear operation on the first data storage node, and a complementary clear line is coupled via a second clear transistor to the second data storage node for performing a clear operation on the second data storage node. In one form the first clear transistor is an NMOS transistor and wherein the second clear transistor is a PMOS transistor. In another form the first clear transistor is coupled to ground and the second clear transistor is coupled to a voltage source. In yet another form the clear operation sets the first data storage node to a logic low state and sets the second data storage node to a logic high state. In another form a read port is coupled to the first data storage node. In another form there is provided an N by M array of storage elements as described herein, wherein N and M are each an integer.

There is also provided a storage element having a first data storage node and a second data storage node. The first data storage node is coupled to a bit line via a first pass transistor and the second data storage node is coupled to a complementary bit line via a second pass transistor. A clear line is coupled via a first clear transistor to the first data storage node for performing a clear operation on the first data storage node, and an inverter is coupled to the clear line to generate an inverted clear line signal. The inverted clear line signal is coupled to a second clear transistor for performing a clear operation on the second data storage node. The first clear transistor is an NMOS transistor and wherein the second clear transistor is a PMOS transistor. In one form the first clear transistor is coupled to ground and the second clear transistor is coupled to a voltage source. In another form the clear operation is performed to set the first data storage node to a logic low state and to set the second data storage node to a logic high state. In yet another form a read port is coupled to the first data storage node. In another form there is provided an N by M array of storage elements as described herein, wherein N and M are each an integer.

In another form there is provided a storage element having a first data storage node and a second data storage node. The first data storage node is coupled to a bit line via a first pass transistor and the second data storage node is coupled to a complementary bit line via a second pass transistor. A clear line is coupled via a first clear transistor to the first data storage node for performing a clear operation on the first data storage node. The clear line is coupled via a second clear transistor to the second data storage node for performing a clear operation on the second data storage node. In one form the first clear transistor is an NMOS transistor and the second clear transistor is an NMOS transistor. In yet another form the first clear transistor is coupled to ground and the second clear transistor is coupled to a voltage source. In yet another form the clear operation is performed to set the first data storage node to a logic low state and set the second data storage node to a logic high state. In yet another form there is provided an N by M array of storage elements as described herein, wherein N and M are each an integer. In another form there is provided a read port coupled to the first data storage node.

In one form there is provided a method in a storage element having a first data storage node and a second data storage node. The first data storage node is coupled to a bit line via a first pass transistor and the second data storage node is coupled to a complementary bit line via a second pass transistor. A first clear transistor is coupled to the first data storage node. A second clear transistor is coupled to the second data storage node. A clear operation on the first data storage node and the second data storage node is performed by providing a clear signal to the first clear transistor and the second clear transistor. In one form the clear operation is performed by providing a logic high value as the clear signal to the first clear transistor and providing a logic low value as the clear signal to the second clear transistor. In one form the first clear transistor is an NMOS transistor and the second clear transistor is a PMOS transistor. In another form the clear operation further includes providing a logic high value as the clear signal to each of the first clear transistor and the second clear transistor. In one form each of the first clear transistor and the second clear transistor is an NMOS transistor.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. Accordingly, the specification and figures are to be regarded in an illustrative rather than a restrictive sense, and all such modifications are intended to be included within the scope of the present invention.

What is claimed is:

1. A storage element comprising:
    a first data storage node and a second data storage node, wherein the first data storage node is coupled to a bit line via a first pass transistor and wherein the second data storage node is coupled to a complementary bit line via a second pass transistor; and
    a clear line coupled via a first clear transistor to the first data storage node for performing a clear operation on the first data storage node and a complementary clear line coupled via a second clear transistor to the second data storage node for performing a clear operation on the second data storage node.

2. The storage element of claim 1, wherein the first clear transistor is an NMOS transistor and wherein the second clear transistor is a PMOS transistor.

3. The storage element of claim 1, wherein the first clear transistor is coupled to ground and wherein the second clear transistor is coupled to a voltage source.

4. The storage element of claim 1, wherein the clear operation is performed to set the first data storage node to a logic low state and to set the second data storage node to a logic high state.

5. The storage element of claim 1 further comprising a read port coupled to the first data storage node.

6. An N by M array of storage elements of claim 1, wherein N and M are each an integer.

7. A storage element comprising:
   a first data storage node and a second data storage node, wherein the first data storage node is coupled to a bit line via a first pass transistor and wherein the second data storage node is coupled to a complementary bit line via a second pass transistor; and
   a clear line coupled via a first clear transistor to the first data storage node for performing a clear operation on the first data storage node and an inverter coupled to the clear line to generate an inverted clear line signal, and wherein the inverted clear line signal is coupled to a second clear transistor for performing a clear operation on the second data storage node.

8. The storage element of claim 7, wherein the first clear transistor is an NMOS transistor and wherein the second clear transistor is a PMOS transistor.

9. The storage element of claim 7, wherein the first clear transistor is coupled to ground and wherein the second clear transistor is coupled to a voltage source.

10. The storage element of claim 7, wherein the clear operation is performed to set the first data storage node to a logic low state and to set the second data storage node to a logic high state.

11. The storage element of claim 7 further comprising a read port coupled to the first data storage node.

12. An N by M array of storage elements of claim 7, wherein N and M are each an integer.

13. A storage element comprising:
   a first data storage node and a second data storage node, wherein the first data storage node is coupled to a bit line via a first pass transistor and wherein the second data storage node is coupled to a complementary bit line via a second pass transistor; and
   a clear line coupled via a first clear transistor to the first data storage node for performing a clear operation on the first data storage node and the clear line coupled via a second clear transistor to the second data storage node for performing a clear operation on the second data storage node.

14. The storage element of claim 13, wherein the first clear transistor is an NMOS transistor and wherein the second clear transistor is an NMOS transistor.

15. The storage element of claim 13, wherein the first clear transistor is coupled to ground and wherein the second clear transistor is coupled to a voltage source.

16. The storage element of claim 13, wherein the clear operation is performed to set the first data storage node to a logic low state and to set the second data storage node to a logic high state.

17. An N by M array of storage elements of claim 13, wherein N and M are each an integer.

18. The storage element of claim 13 further comprising a read port coupled to the first data storage node.

19. A method in a storage element comprising a first data storage node and a second data storage node, wherein the first data storage node is coupled to a bit line via a first pass transistor and wherein the second data storage node is coupled to a complementary bit line via a second pass transistor, the method comprising:
   coupling a first clear transistor to the first data storage node;
   coupling a second clear transistor to the second data storage node; and
   performing a clear operation on the first data storage node and the second data storage node by providing a clear signal to the first clear transistor and the second clear transistor.

20. The method of claim 19, wherein performing the clear operation further comprises providing a logic high value as the clear signal to the first clear transistor and a logic low value is provided as the clear signal to the second clear transistor.

21. The method of claim 20, wherein the first clear transistor is an NMOS transistor and the second clear transistor is a PMOS transistor.

22. The method of claim 19, wherein performing the clear operation further comprises providing a logic high value as the clear signal to each of the first clear transistor and the second clear transistor.

23. The method of claim 22, wherein each of the first clear transistor and the second clear transistor is an NMOS transistor.

* * * * *